(12) United States Patent
Tapie et al.

(10) Patent No.: US 8,170,013 B2
(45) Date of Patent: *May 1, 2012

(54) AUTOMATIC COMPENSATION OF A DELAY OF A SYNCHRONIZATION SIGNAL IN A PACKET SWITCHING NETWORK

(75) Inventors: Thierry Tapie, Rennes (FR); Serge Defrance, Rennes (FR); Izabela Grasland, Breteil (FR)

(73) Assignee: Thomson Licensing, Boulogne, Billancourt (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/452,056

(22) PCT Filed: Jun. 6, 2008

(86) PCT No.: PCT/EP2008/057095
§ 371 (c)(1),
(2), (4) Date: Dec. 14, 2009

(87) PCT Pub. No.: WO2008/151996
PCT Pub. Date: Dec. 18, 2008

(65) Prior Publication Data
US 2010/0135288 A1    Jun. 3, 2010

(30) Foreign Application Priority Data

Jun. 12, 2007  (FR) ...................................... 07 55690

(51) Int. Cl.
*H04L 12/28* (2006.01)
(52) U.S. Cl. ............. 370/389; 370/503; 370/516; 8/536
(58) Field of Classification Search .................. 370/389, 370/503, 516; 348/536
See application file for complete search history.

(56) References Cited

U.S. PATENT DOCUMENTS 3,763,317 A * 10/1973 Coleman et al. .............. 327/154
(Continued)

FOREIGN PATENT DOCUMENTS

EP          0936816          8/1999
(Continued)

OTHER PUBLICATIONS

IEEE Instrumentation and Measurement Society: "IEEE std 1588-2002 IEEE Standard for a Precision Clock Synchronization Protocol for Networked Measurement and Control Systems (Part)" IEEE Standards, Nov. 8, 2002, pp. 10-25, 79-82, XP002467037.

(Continued)

*Primary Examiner* — Ayaz Sheikh
*Assistant Examiner* — Andrew C Lee
(74) *Attorney, Agent, or Firm* — Jeffrey D. Carter (57) ABSTRACT

The present invention relates to a sending device able to send packets in a network comprising at least two stations, the said device comprising means for extracting image pips on the basis of a synchronization signal, initializing an image counter on the basis of the image pips, initializing a counter every "m" zero-crossings of the image counter, the counter being regulated by a clock produced by the image counter, sampling the counter every period $T_{smp}$, where $T_{smp}$ emanates from a time base synchronized on all the stations of the said network; and sending packets containing the samples of the counter in the network. According to the invention, it comprises means for receiving packets containing samples sent by a station of the network as echo to the samples and when samples are received for:

evaluating a duration of propagation of samples over an outward-return trip between the said device and the said station;
determining a phase shift value $\Delta\phi$ on the basis of the duration of propagation;
sending the phase shift value $\Delta\phi$ in the network.

9 Claims, 7 Drawing Sheets

U.S. PATENT DOCUMENTS

| | | | | |
|---|---|---|---|---|
| 4,292,652 | A * | 9/1981 | Yumde et al. | 348/424.1 |
| 4,532,547 | A * | 7/1985 | Bennett | 348/518 |
| 4,636,858 | A * | 1/1987 | Hague et al. | 348/463 |
| 4,742,544 | A * | 5/1988 | Kupnicki et al. | 380/215 |
| 4,912,549 | A * | 3/1990 | Altman et al. | 348/496 |
| 5,155,595 | A * | 10/1992 | Robison | 348/500 |
| 5,303,050 | A * | 4/1994 | Nishimura et al. | 348/211.2 |
| 5,473,385 | A * | 12/1995 | Leske | 375/240.26 |
| 5,499,375 | A * | 3/1996 | Miyaguchi | 712/2 |
| 5,745,314 | A * | 4/1998 | Ikeda et al. | 360/51 |
| 5,805,933 | A * | 9/1998 | Takahashi | 710/72 |
| 6,385,267 | B1 * | 5/2002 | Bowen et al. | 375/376 |
| 6,801,591 | B1 * | 10/2004 | Frencken | 375/373 |
| 7,071,996 | B2 * | 7/2006 | Naegle | 348/500 |
| 7,203,240 | B2 * | 4/2007 | Kim et al. | 375/240.28 |
| 7,471,340 | B1 * | 12/2008 | Chowdhury et al. | 348/572 |
| 7,730,230 | B1 * | 6/2010 | Kondapalli | 710/15 |
| 2004/0017486 | A1 | 1/2004 | Cooper et al. | |
| 2004/0073930 | A1 * | 4/2004 | Demas et al. | 725/71 |
| 2004/0227855 | A1 * | 11/2004 | Morel et al. | 348/512 |
| 2004/0257469 | A1 * | 12/2004 | Compton et al. | 348/500 |
| 2004/0264478 | A1 | 12/2004 | Van Der Valk et al. | |
| 2006/0224336 | A1 * | 10/2006 | Petras et al. | 702/62 |
| 2008/0019398 | A1 * | 1/2008 | Genossar et al. | 370/498 |
| 2009/0034610 | A1 * | 2/2009 | Lee et al. | 375/240.02 |

FOREIGN PATENT DOCUMENTS

| | | |
|---|---|---|
| EP | 1471745 | 10/2004 |
| EP | 1768383 | 3/2007 |
| FR | 2898453 | 9/2007 |
| WO | WO 2006/063925 | 6/2006 |

OTHER PUBLICATIONS

Search Report Dated Sep. 2, 2008.

"MPEG-2, Part 1: System (extract)" ISO/IEC, No. DIS13818-1, 1995, pp. 98-100.

* cited by examiner

AUTOMATIC COMPENSATION OF A DELAY OF A SYNCHRONIZATION SIGNAL IN A PACKET SWITCHING NETWORK

This application claims the benefit, under 35 U.S.C. §365 of International Application PCT/EP2008/057095, filed Jun. 6, 2008, which was published in accordance with PCT Article 21(2) on Dec. 18, 2008 in English and which claims the benefit of French patent application No. 0755690, filed Jun. 12, 2007.

FIELD OF THE INVENTION

The present invention pertains to the field of video equipment.

The present invention pertains more particularly to a sender device and to a receiver device for the transmission of a synchronization signal, for example of "Genlock" type (synchronization locking), on a packet switching communication network, for example of IP type (the acronym standing for the expression "Internet Protocol"), whether the network is wired (for example Ethernet (IEEE 802.3)) or non-wired (for example IEEE 802.16 D-2004).

PRIOR ART

Progress in the capacity of IP networks to transport signals of any type (data or video) implies that it is possible to use such networks as a "backbone" architecture for video studios. A major benefit of this advance is that there is then a unique infrastructure for data transport. Whereas in the past, several media were required in order to transport various types of signals between equipment, the multiplexing properties offered by the IP layer make it possible to reduce the number of media required to one: an IP network which links the various items of equipment.

In the prior art, the synchronization of video equipment (cameras, etc.) in a studio is done by transmitting a synchronization signal commonly called "Genlock" or else "black burst". For example, the Genlock signal is composed of two synchronization signals, one is repeated every 40 ms and indicates the start of the video frame, the other is repeated every 64 µs (for a standard format and less for an HD format) and indicates the start of the lines in the video frame. The waveforms of the synchronization signals are dependent on the format of the image transmitted on the network. For example for a high-definition image, the synchronization signal has a form that is termed tri-level (−300 mV, 0 V, +300 mV).

Known drawbacks exhibited by an IP/Ethernet network stem from the fact that it introduces on the one hand strong jitter and on the other hand latency, into a signals transmission, and in particular for the transmission of a synchronization signal. The jitter results in temporal fluctuations of the duration with which the information carried by the synchronization signal reaches the equipment; the latency induces a delay, in general fixed over time in the synchronization of the equipment.

In the prior art, devices are known for reconstructing, at the level of each camera, a timing clock specific to this camera and making it possible to circumvent jitter induced by transmission on the network. The principle of these devices relies on strong attenuation of the amplitude of the jitter of the synchronization signal at the reception level. It is thus possible to guarantee that an image generated by a camera is rigorously in phase with all the images generated by the neighbouring cameras linked to the same network.

Examples of such devices for attenuating jitter are described in international application PCT FR2007/050918, and they act on so-called digital counting signals (or PCR, which is the acronym standing for the expression "Program Clock Reference"), which are representative of very precise reference clock signals. These digital signals are provided to cameras through a network so that they can locally reconstruct clock signals in phase with the reference clock. International patent application PCT FR2007/050918 thus proposes a sending device and a reception device making it possible to alleviate the effects of jitter. In this international patent application are described a sending device able to send packets in a packet communication network comprising at least two stations and a reception device able to receive packets from a similar network.

However, this international patent application does not mention the problem of automatic decrease or removal of a delay between the synchronization of two items of equipment caused by network latency, that is to say a duration of the information transport between the two items of equipment which is greater than a period $T_{smp}$ which is a duration characteristic of the information transported.

The problem consists of the transmission of information up to a remote item of equipment through an IP/Ethernet network making it possible to automatically regenerate an image pip rigorously in phase with the send side image pip. This amounts to finding a means making it possible to generate on a remote item of equipment connected to an IP network, introducing jitter and latency, a video clock and an image synchronization pip without intervention, measurement or correction, carried out by an operator. These two signals make it possible to regenerate a Genlock signal rigorously in phase with a reference Genlock signal.

OVERVIEW OF THE INVENTION

The technical problem that the present invention proposes to solve is the transmission of a synchronization signal through a packet switched network, with non-constant duration of transmission.

For this purpose, the present invention relates, according to a first aspect, to a sending device able to send packets in a packet communication network comprising at least two stations, the said device comprising means for:
  extracting image pips on the basis of a synchronization signal;
  initializing an image counter on the basis of the said image pips;
  initializing a counter CPT_PCR every "m" zero-crossings of the image counter, the counter CPT_PCR being regulated by a clock produced by the image counter;
  sampling the counter CPT_PCR every period $T_{smp}$, where $T_{smp}$ emanates from a time base synchronized on all the stations of the said network; and
  sending packets containing the samples $PCR_e$ of the counter CPT_PCR in the network,
characterized in that it comprises, furthermore, means for:
  receiving packets containing samples $PCR\_loc_1$ sent by a station of the network as echo to the samples $PCR_e$;
  when samples $PCR\_loc_1$ are received:
    evaluating a duration of propagation of samples over an outward-return trip between the said device and the said station;
    determining a phase shift value $\Delta\Phi$ on the basis of the duration of propagation;
    sending the phase shift value $\Delta\Phi$ in the network.

Preferably, the synchronization signal is of Genlock type.

According to an embodiment, the counting ramp CSE_PCR is a PCR counter.

According to a particular mode of implementation, the time base synchronized on all the stations of the network is of IEC 61588 type.

The present invention relates, according to a second aspect, to a reception device able to receive packets in a packet communication network comprising at least two stations, the said device comprising means for:

receiving packets containing samples $PCR_r$ of the said network, the said samples $PCR_r$ originating from data sampled every period $T_{smp}$, where $T_{smp}$ emanates from a time base synchronized on all the stations of the said network;

regenerating a counting ramp $CSR\_PCR_1$ with the aid of a phase-locked loop $PLL_1$ receiving the samples $PCR_r$, and furthermore delivering local samples $PCR\_loc_1$ every period $T_{smp}$ and a reconstituted clock $CLK\_out_1$;

initializing, at every zero-crossing of the counting ramp $CSR\_PCR_1$, an image counter CPT which is regulated by the reconstituted clock $CLK\_out_1$;

generating image pips every zero-crossing of the said image counter CPT; and reconstituting a synchronization signal on the basis of the said image pips;

characterized in that it comprises, furthermore, means for:

sending in the network packets containing the local samples $PCR\_loc_1$;

when a phase shift value $\Delta\Phi$ is received:
  phase-shifting the samples received $PCR_r$ by the phase shift value $\Delta\Phi$, to generate phase-shifted samples $PCR_c$;
  supplying the phase-locked loop $PLL_1$ with the phase-shifted samples $PCR_c$.

Preferably, the synchronization signal is of Genlock type.

According to an embodiment, the counting ramp $CSR\_PCR_1$ is a PCR counter.

The image counter CPT can be a 40-ms counter.

According to a particular mode of implementation, the time base synchronized on all the stations of the network is of IEC 61588 type.

A first advantage of the invention resides in the capacity that it offers to automatically compensate a delay in the trunking of an image pip between two items of equipment which are synchronized by the image pip. This advantage is particularly appreciable when the delay induced by the network is not stable over time and therefore cannot be compensated once and for all.

A second advantage of the invention is its capacity to ensure simultaneous compensation of several trunking delays up to various stations connected to the network, on the basis of a single sending device.

BRIEF DESCRIPTION OF THE DRAWINGS

The invention will be better understood with the aid of the description, given hereinafter purely by way of explanation, of an embodiment of the invention, with reference to the appended figures.

DETAILED DESCRIPTION OF THE EMBODIMENTS OF THE INVENTION

Figure 1:
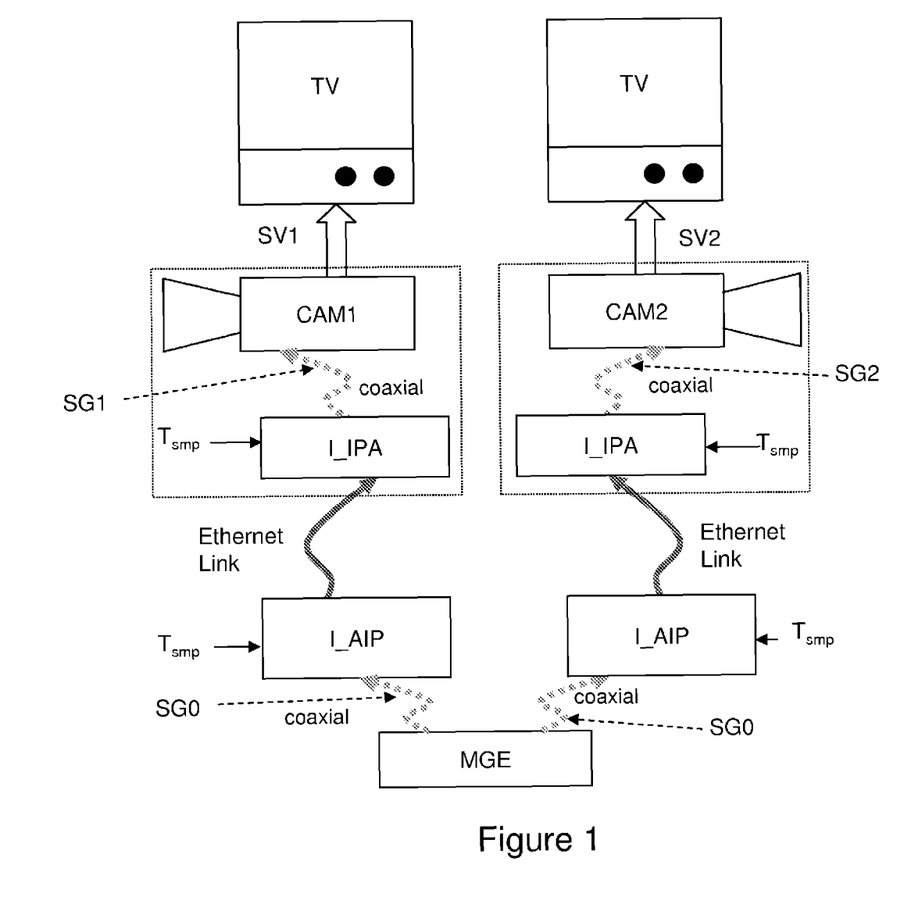
FIG. 1 illustrates the transmission of Genlock information between two cameras linked by an IP/Ethernet network.

The present analogue world is interfaced to the IP/Ethernet network send side, and the IP/Ethernet network is interfaced to the analogue world receive side, as is illustrated in FIG. 1.

In this same figure, the send side consists of a "Genlock Master" MGE which is connected to an Analogue/IP interface I_AIP. The Genlock Master MGE produces a Genlock signal SG0 destined for the interfaces I_AIP.

The receive side consists of two cameras (CAM1, CAM2) each connected to an IP/Analogue interface I_IPA. The interfaces I_IPA which will, eventually, be included in the cameras themselves have the task of reconstructing Genlock signals SG1, SG2 destined for the cameras CAM1, CAM2. The cameras CAM1, CAM2 each produce a video signal SV1, SV2 that one wishes to fully synchronize.

The send and receive sides are linked together by a packet switching network which gives rise to jitter appearing on the Genlock signal SG0.

A sampling pip, at the period $T_{smp}$, is generated on the basis of a first synchronization layer, for example IEEE1588, and is addressed to the send and receive sides. Specifically, the PTP protocol (the acronym standing for "Precision Time Protocol") based on IEEE1588 makes it possible to obtain synchronization between the items of equipment connected to an Ethernet network of the order of a microsecond. Stated otherwise, all the time bases of each item of equipment evolve at the same time to within a precision of the order of a microsecond. These time bases can be used in this case to each generate their own sampling pip at the period $T_{smp}$. The use of the IEEE1588 layer is not a compulsory route.

Any system making it possible to provide sampling pips at the period $T_{smp}$ on the various items of equipment connected to a network could be suitable. It is possible for example to use a sampling pip of period 5 ms arising from a wireless transmission physical layer.

Figure 2:
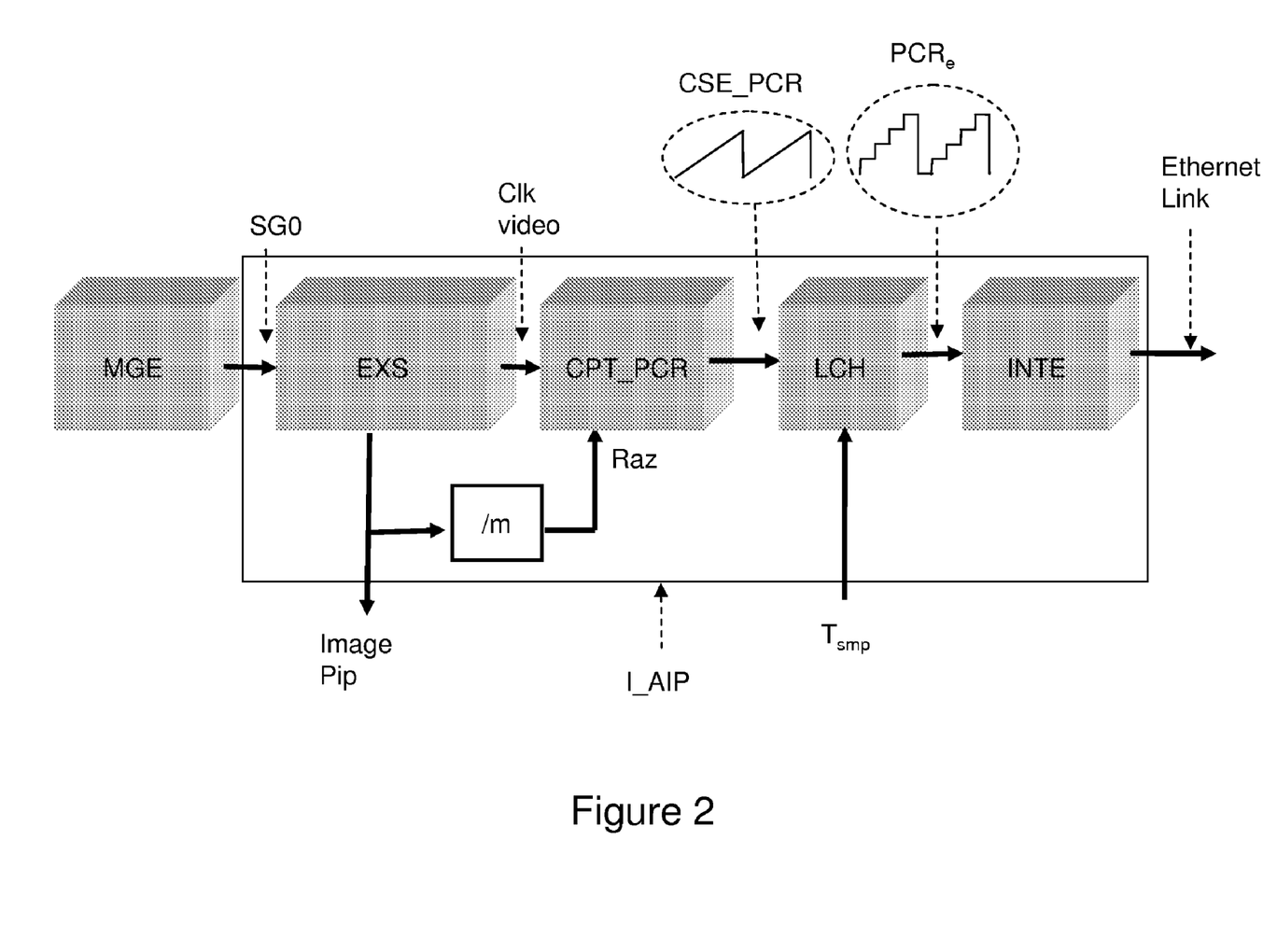
FIG. 2 illustrates the interfacing between an analogue domain and an IP/Ethernet network, according to the prior art.

Detailed in FIG. 2 are processings of the Genlock signal SG0 arising from MGE, within the interface I_AIP.

First of all, a module EXS extracts synchronization information for the signal SG0 so as to recover a video timing clock (denoted video Clk in FIG. 2). More precisely, the module EXS has the task of generating an image pip at each image start. Moreover, the module EXS comprises an image counter, for example a 40-ms counter, which is not represented in FIG. 2. The output of this image counter evolves according to a counting ramp passing through 0 at each image period, that is to say every 40 ms if the image counter cited as an example above is considered.

The video timing clock is employed to regulate a counter CPT_PCR. The output of the counter CPT_PCR is a counting ramp CSE_PCR, whose period equals m image periods. Every "m" images, the counter CPT_PCR is reinitialized, that is to say the counting ramp CSE_PCR is reset to 0.

Subsequently, a module LCH samples the counting ramp CSE_PCR every period $T_{smp}$ to produce samples $PCR_e$.

These samples $PCR_e$ are dispatched to the network and travel up to the receive side through an interface with network (block INTE).

Figure 3:
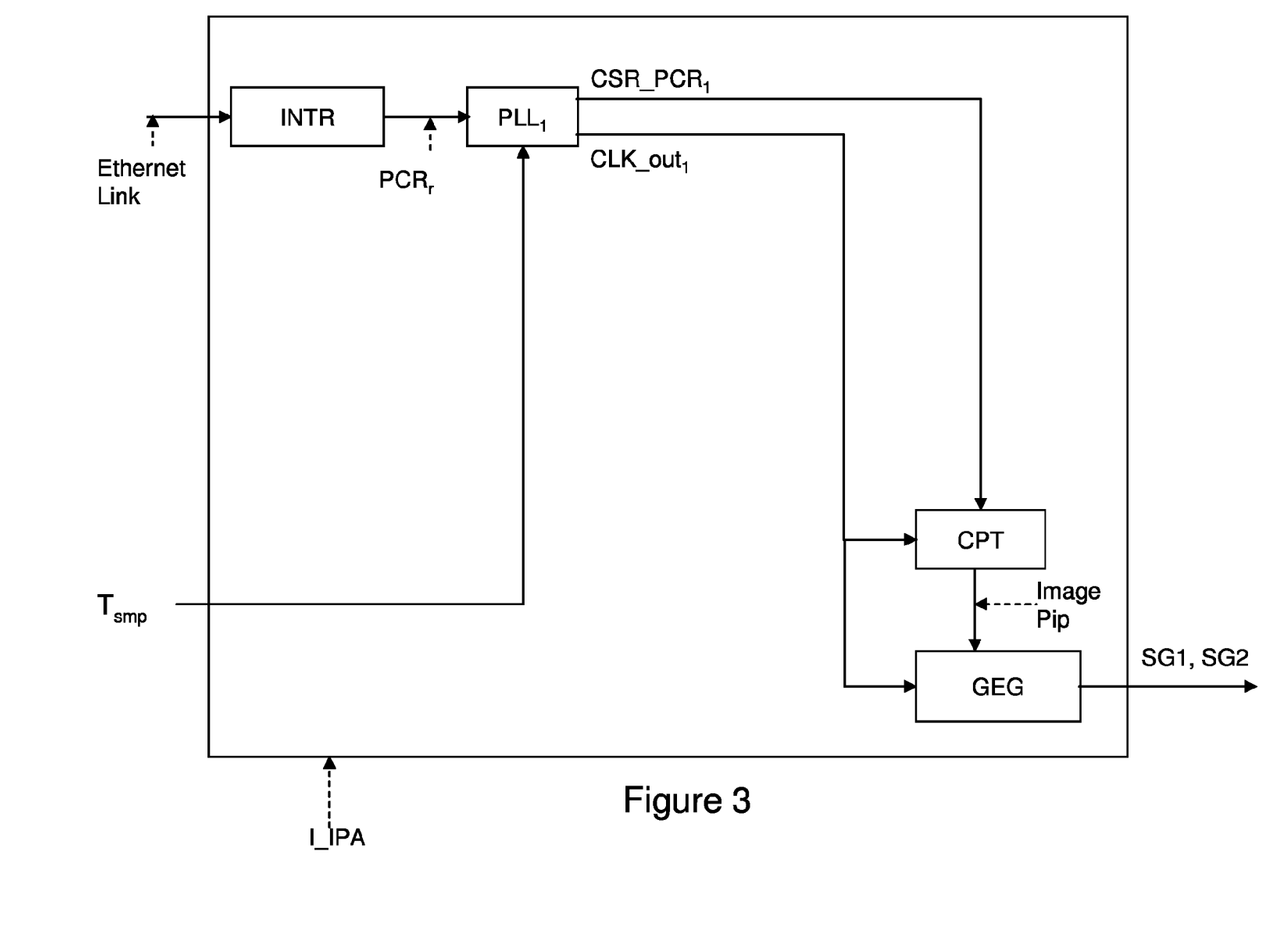
FIG. 3 illustrates the regeneration of the Genlock signal receive side according to the prior art.

FIG. 3 represents the receive side according to the prior art. The interface I_IPA recovers the samples $PCR_e$ which have been dispatched to the network. These samples $PCR_e$ are received through a network interface (module INTR) with a delay related to the transport between the sending device and the reception device: the module INTR produces samples $PCR_r$. The samples $PCR_e$, which have been produced at regular intervals $T_{smp}$ send side, reach the receive side at irregular intervals: this is due predominantly to the jitter introduced during transport over the network. The samples $PCR_r$ are taken into account at regular intervals $T_{smp}$ and therefore, the major part of the jitter introduced during packet transport is eliminated.

The lack of precision between the send and receive sampling instants is absorbed by a phase-locked loop $PLL_1$ whose bandwidth is appropriate. The characteristics of the loop $PLL_1$ guarantee a reconstituted clock CLK_out, generation with a reduced jitter.

The phase-locked loop $PLL_1$ behaves as a system receiving samples $PCR_r$ and delivering:
  a reconstituted clock $CLK\_out_1$,
  a counting ramp $CSR\_PCR_1$ and,
  local samples $PCR\_loc_1$.

When the loop $PLL_1$ operates in the steady state, the samples $PCR_r$ are substantially equal to the samples $PCR\_loc_1$.

The reconstituted clock $CLK\_out_1$ regulates an image counter CPT similar to the send side image counter, for example a 40-ms counter. The image counter CPT is reinitialized each time the counting ramp $CSR\_PCR_1$ crosses through 0. Between two successive initializations, the image counter CPT evolves freely and produces an image pip which supplies a local Genlock generator, GEG to produce a reconstructed Genlock signal SG1, SG2 intended to synchronize the cameras CAM1, CAM2.

The reconstructed Genlock signal SG1, SG2, which is generated on the basis of the counting ramp $CSR\_PCR_1$ and reconstituted clock $CLK\_out_1$ is in phase with the Genlock signal SG0 on the send side, to within a clock tick. The loop $PLL_1$ ensures a filtering which can be modelled as a low-pass filter of order 2.

Figure 4:
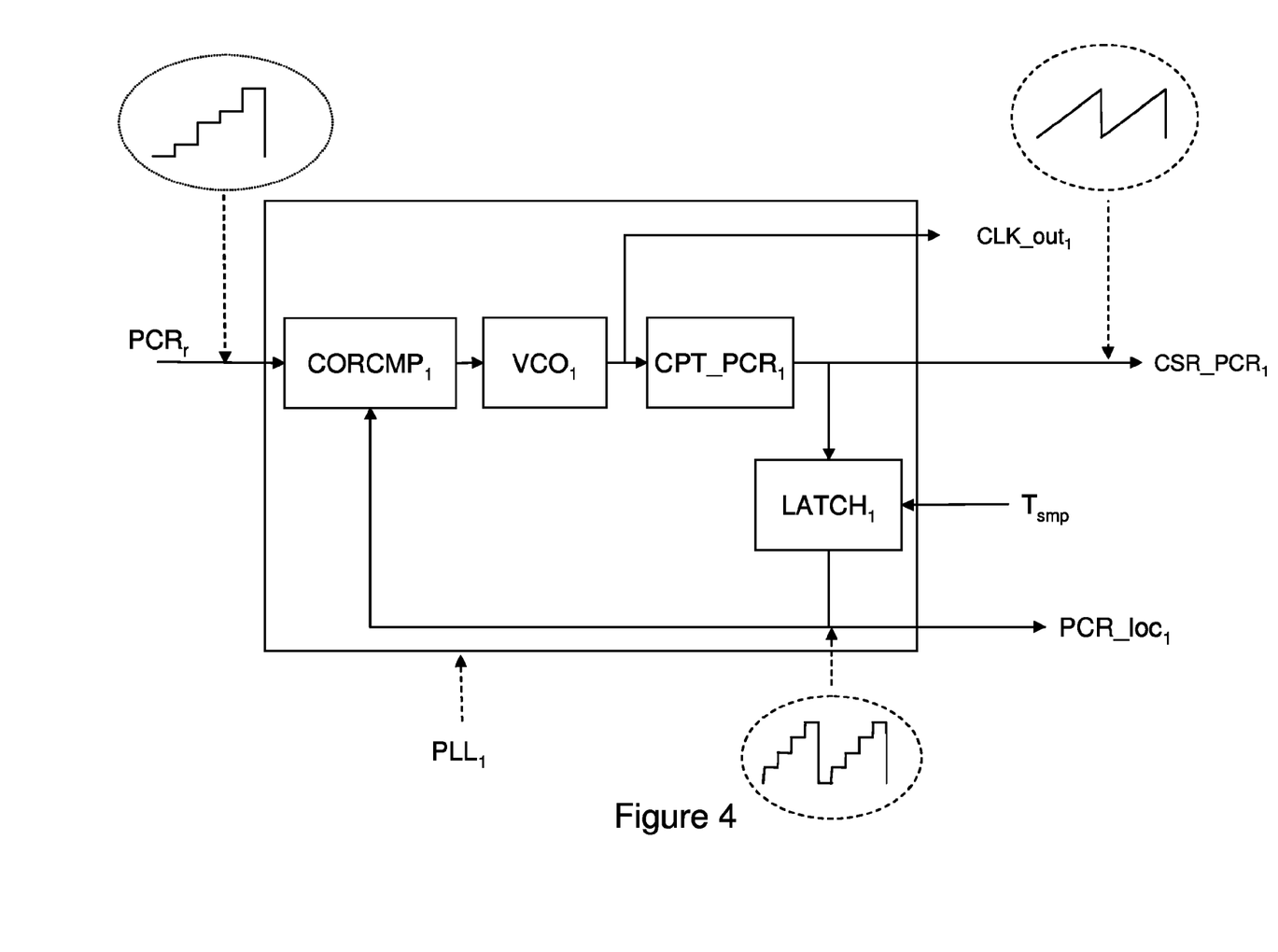
FIG. 4 illustrates the operation of a phase-locked loop employed receive side according to the prior art.

FIG. 4 illustrates a mode of operation of a phase-locked loop $PLL_1$ employed in an interface I_IPA. As represented in FIG. 4, the phase-locked loop $PLL_1$ comprises:
  a corrector/comparator $CORCMP_1$ which receives the samples $PCR_r$ as well as the local samples $PCR\_loc_1$. $CORCMP_1$ delivers a samples comparison result;
  a digital oscillator $VCO_1$ which is controlled by a samples comparison result and which delivers a reconstituted clock $CLK\_out_1$;
  a counter $CPT\_PCR_1$ producing a counting ramp $CSR\_PCR_1$ according to a timing regulated by the reconstituted clock $CLK\_out_1$,
  a value holding system $LATCH_1$, which generates local samples $PCR\_loc_1$ on the basis of the values of the counting ramp $CSR\_PCR_1$ at the instants $T_{smp}$.

The problem area of compensating the duration of interstation information transport is solved by measuring a duration of information transport for an outward-return trip between the send side and the receive side so as to determine and send a phase deviation value to be applied to the samples received on the receive side. The major constraint for this to be achievable is that the instants of sampling of the counter CPT_PCR (send side) and those regulating the sampling carried out within the phase-locked loop of the reception device are identical.

The technical problem posed to the person skilled in the art is that consisting in generating or transmitting an image pip through an IP/Ethernet network introducing a latency, rigorously in phase with the sending and fully synchronous with a receive side clock.

Figure 5:
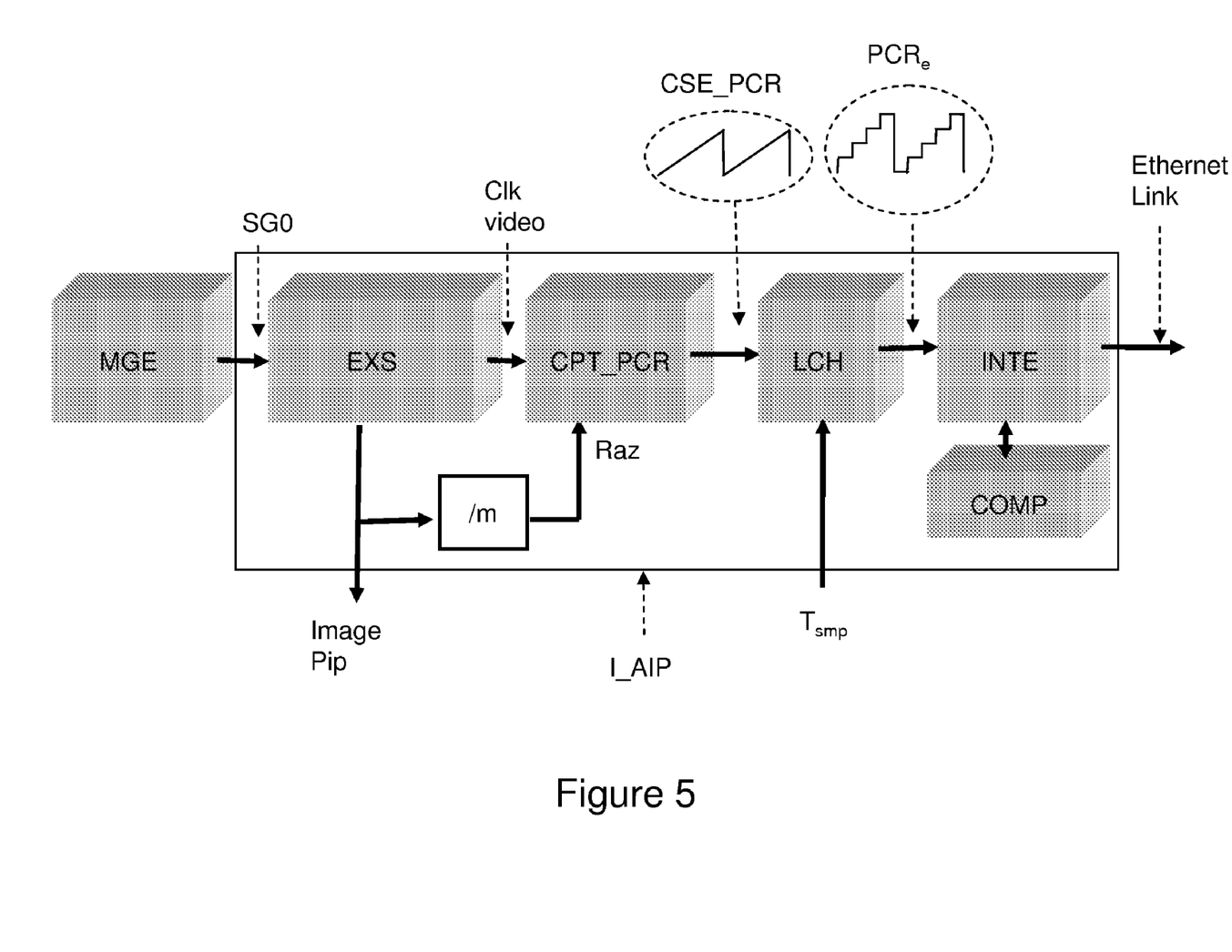
FIG. 5 illustrates the interfacing between an analogue domain and an IP/Ethernet network, according to the invention.

FIG. 5 illustrates the generation of samples $PCR_e$ send side, according to the invention. The analogue/IP interface I_AIP comprises, furthermore, a compensation evaluation module COMP. The module COMP comprises means for:
  receiving packets containing samples $PCR\_loc_1$ sent by a station of the network as echo to the samples $PCR_e$;
  when samples $PCR\_loc_1$ are received:
    evaluating a duration of propagation of samples over an outward-return trip between the said device and the said station;
    determining a phase shift value $\Delta\Phi$ on the basis of the duration of propagation;
    sending the phase shift value $\Delta\Phi$ in the network.

Figure 6:
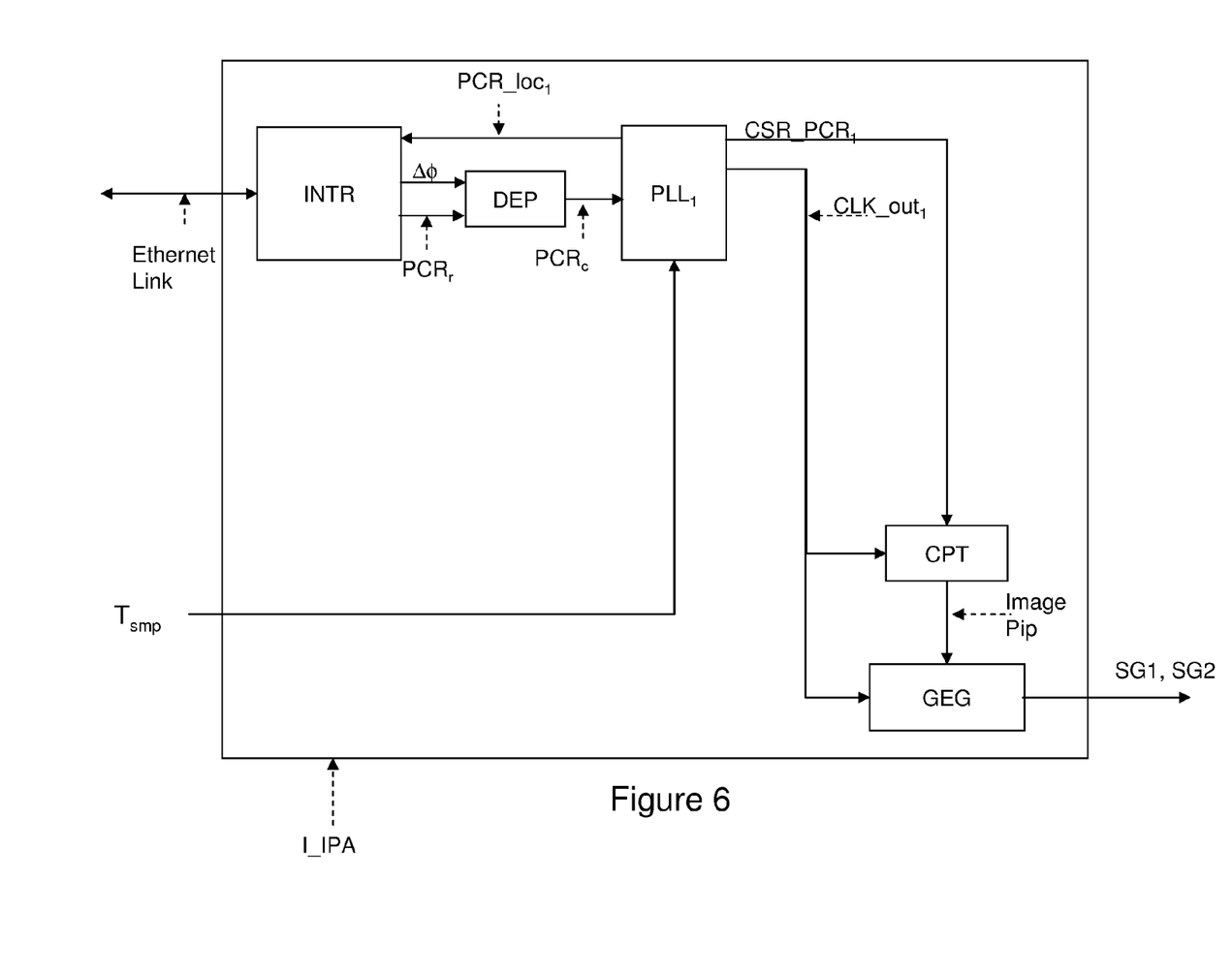
FIG. 6 illustrates the generation of the Genlock signal receive side, according to the invention.

FIG. 6 illustrates the reception of the Genlock signal according to the invention. The IP/analogue interface I_IPA furthermore comprises a phase shift module DEP. The module DEP comprises means for:
  receiving packets containing a phase deviation value $\Delta\Phi$;
  sending in the network packets containing the local samples $PCR\_loc_1$;
  when a phase shift value $\Delta\Phi$ is received:
    phase-shifting the samples received $PCR_r$ by the phase shift value $\Delta\Phi$, to generate phase-shifted samples $PCR_c$;
    supplying the phase-locked loop $PLL_1$ with the phase-shifted samples $PCR_c$.

Two phases of operation of the sending and reception devices according to the invention are distinguished:
  a first phase, termed the "latching phase", during which the sending device does not receive any samples $PCR\_loc_1$ originating from a reception device. This phase starts upon turning on the sending and reception devices. The latching phase is completed when local samples $PCR\_loc_1$ produced by a reception device reach the sending device. During this phase, the sending device cannot evaluate a duration of propagation of samples over an outward-return trip between the sending device and the reception device. It cannot, a fortiori, send any phase shift value $\Delta\Phi$ in the network. Consequently, in the course of the latching phase, the reception device operates as in the prior art exhibited above;
  a second phase, termed the "tracking phase" starts when a phase shift value $\Delta\Phi$ to be applied reaches the reception device. The tracking phase is completed when the module DEP no longer receives any phase shift value $\Delta\Phi$. In the course of the tracking phase, the module DEP produces phase-shifted samples $PCR_c$ on the basis of the phase shift value $\Delta\Phi$ and samples received $PCR_r$ that it has received jointly. These samples $PCR_c$ supply the loop $PLL_1$ of the reception device. The loop $PLL_1$ produces local samples $PCR\_loc_1$ which are dispatched to the network and received by the module COMP of the reception device. The module COMP evaluates a duration of propagation of samples over an outward-return trip between the sending device and the reception device. Then, the module COMP determines a phase shift value $\Delta\Phi$ on the basis of the duration of propagation and sends it over the network.

Advantageously, the value ΔΦ is determined so that the samples PCR_loc$_1$ are identical to the samples PCR$_e$.

Advantageously, the phase shift value ΔΦ to be applied corresponds to an integer number of periods T$_{smp}$.

Advantageously, the evaluation of the duration of propagation consists of a comparison between the samples PCR_loc$_1$ and the samples PCR$_e$ of the counter CPT_PCR.

Figure 7:
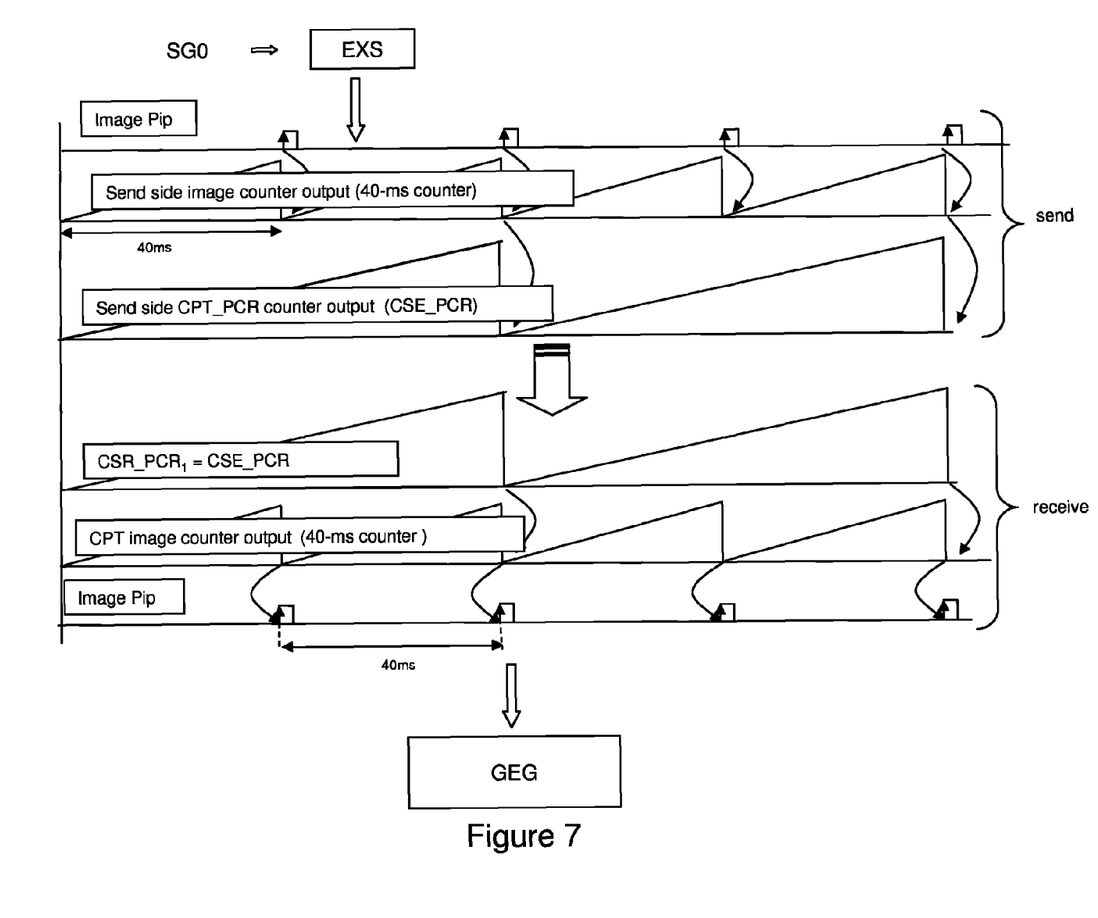
FIG. 7 represents counting ramps and image counter outputs on the send side and on the receive side.

FIG. 7 illustrates the transmission of potential image pip information.

Send side: on the basis of the Genlock signal SG0, image pips are extracted. On the basis of the image pips, for example of 40 ms recurrence, the sending image counter is initialized. Every "m" zero-crossings of the sending image counter, the counter CPT_PCR is initialized: that is to say the output ramp CSE_PCR produced by the counter CPT_PCR is set to zero periodically. A sampling of the output ramp CSE_PCR, at a timing rate T$_{smp}$ provided by the network, produces samples PCR$_e$ which are dispatched to the network.

As echo to a dispatch of samples PCR$_e$, the send side receives samples PCR_loc$_1$ originating from a reception device. It evaluates, by comparing the samples PCR_loc$_1$ with the samples PCR$_e$, a duration of propagation Δr of the samples corresponding to an outward-return trip between the sending device and the reception device, the trip starting on the send side. On the basis of this duration Δr, the send side determines a phase shift value ΔΦ. This value ΔΦ is determined in such a way that, when the samples PCR$_r$ received on the receive side are phase-shifted by this value ΔΦ, the phase-shifted samples PCR$_c$ are fully in phase with the samples PCR$_e$ sent on the send side.

Receive side: during the latching phase, samples PCR$_r$ are received by the reception device with a delay Δr1 with respect to the date at which they were dispatched over the network. A counting ramp CSR_PCR$_1$ is regenerated by the phase-locked loop PLL$_1$, in phase with a virtual sending counting ramp which would correspond to the samples PCR$_e$ transmitted with a zero delay. In doing so, the loop PLL$_1$ also produces local samples PCR_loc$_1$ which are returned to the send side, here again with a certain delay Δr2.

In the tracking phase, the reception device receives jointly the samples PCR$_r$ and a phase shift value ΔΦ originating from the sending device. The value ΔΦ has been determined by evaluating the duration of propagation of samples over an outward-return trip between the sending device and the reception device Δr=Δr1+Δr2.

The samples received PCR$_r$ are phase-shifted by the value ΔΦ to give phase-shifted samples PCR$_c$. The phase-locked loop PLL$_1$ which receives the phase-shifted samples PCR$_c$ generates a counting ramp CSR_PCR$_1$, which is, this time, in phase with the sending counting ramp CSE_PCR.

When the ramp CSR_PCR$_1$ crosses through zero, the reception image counter CPT is initialized and thereafter evolves freely. The latter will remain necessarily synchronous with the counter CPT_PCR$_1$ since they both use the same reconstituted clock CLK_out$_1$. The crossing through zero of the output of the reception image counter CPT makes it possible to generate the reception image pip. On the basis of this reception image pip, it is possible to reconstruct with the Genlock signal SG1, SG2 receive side.

It is possible to facilitate the demarcation of the latching and tracking phases. For example, so long as the local samples PCR_loc$_1$ are not available as output from a reception device, by making the reception device send a code indicating that the phase in progress is the latching phase.

The invention is described in the foregoing by way of example. It is understood that the person skilled in the art is in a position to implement various alternatives of the invention without however departing from the scope of the patent.

The invention claimed is:

1. A device operative to send packets in a packet communication network comprising at least two stations, said device comprising:
    means for extracting image pips on the basis of a synchronization signal;
    means for initializing an image counter on the basis of the said image pips;
    means for initializing a counter in response to zero-crossings of the image counter, the counter being regulated by a clock produced by the image counter;
    means for sampling the counter every period T$_{smp}$, where T$_{smp}$ emanates from a time base synchronized on all the stations of the network;
    means for sending packets containing the samples of the counter in the network;
    means for receiving packets containing samples sent by a station of the network as echo samples to the samples of the counter sent by the device in the network;
    means for evaluating a duration of propagation of samples over an outward-return trip between said device and said station in response to the echo samples;
    means for determining a phase shift value Δφ on the basis of the duration of propagation; and
    means for sending the phase shift value Δφ in the network.

2. The device according to claim 1, wherein the phase shift value Δφ is determined so that the samples of the counter sent by the device in the network are identical to the echo samples.

3. The device according to claim 1, wherein the phase shift value Δφ to be applied corresponds to an integer number of periods T$_{smp}$.

4. The device according to claim 1, wherein the evaluation of the duration of propagation includes a comparison between the echo samples and the samples of the counter.

5. The device according to claim 1, wherein the synchronization signal is of Genlock type.

6. The device according to claim 1, wherein the time base synchronized on all the stations of the network is according to the IEC 61588 standard.

7. A device operative to receive packets in a packet communication network comprising at least two stations, said device comprising:
    means for receiving packets containing samples of the network, the samples originating from data sampled every period T$_{smp}$, where T$_{smp}$ emanates from a time base synchronized on all the stations of the network;
    means for regenerating a counting ramp via a phase-locked loop receiving the samples and furthermore delivering local samples every period T$_{smp}$ and a reconstituted clock;
    means for initializing, at every zero-crossing of the counting ramp, an image counter which is regulated by the reconstituted clock;
    means for generating image pips every zero-crossing of the image counter;
    means for reconstituting a synchronization signal on the basis of the image pips;
    means for receiving packets containing a phase shift value Δφ;
    means for sending in the network packets containing the local samples;
    means for phase-shifting the samples received by the phase shift value Δφ, to generate phase-shifted samples in response to the phase shift value Δφ; and means for supplying the phase-locked loop with the phase-shifted samples.

8. The device according to claim 7, wherein the counting ramp is a program clock reference (PCR) counter.

9. The device according to claim 7, wherein the time base synchronized on all the stations of the network is according to the IEC 61588 standard.

* * * * *